(12) United States Patent
Jeong et al.

(10) Patent No.: US 7,956,692 B2
(45) Date of Patent: Jun. 7, 2011

(54) WIDE-BAND AMPLIFIER CIRCUIT WITH IMPROVED GAIN FLATNESS

(75) Inventors: Moon Suk Jeong, Gyunggi-do (KR); Yoo Sam Na, Seoul (KR)

(73) Assignee: Samsung Electro-Mechanics, Co., Ltd., Suwon (KR)

( * ) Notice: Subject to any disclaimer, the term of this patent is extended or adjusted under 35 U.S.C. 154(b) by 0 days.

(21) Appl. No.: 12/620,151

(22) Filed: Nov. 17, 2009

(65) Prior Publication Data
US 2010/0308920 A1    Dec. 9, 2010

(30) Foreign Application Priority Data

Jun. 9, 2009 (KR) ........................ 10-2009-0051081

(51) Int. Cl.
*H03F 3/191* (2006.01)
(52) U.S. Cl. .................... 330/302; 330/310; 330/311
(58) Field of Classification Search .................. 330/302, 330/310, 311
See application file for complete search history.

(56) References Cited

U.S. PATENT DOCUMENTS

| 5,995,814 A | 11/1999 | Yeh | |
|---|---|---|---|
| 6,509,799 B1 * | 1/2003 | Franca-Neto | 330/311 |
| 7,193,477 B2 * | 3/2007 | Chang et al. | 330/302 |
| 2006/0170502 A1 * | 8/2006 | Cha et al. | 330/311 |

FOREIGN PATENT DOCUMENTS

KR    100828187    4/2008

OTHER PUBLICATIONS

Korean Office Action from KR application No. 10-2009-0051081.

* cited by examiner

*Primary Examiner* — Khanh V Nguyen
(74) *Attorney, Agent, or Firm* — Lowe, Hauptman, Ham & Berner, LLP

(57) ABSTRACT

There is provided a wide-band amplifier circuit with improved gain flatness. The wide-band amplifier circuit includes a first resonant load unit connected to an operating power terminal, providing a preset first load, and forming a preset first resonant point, a second resonant load unit connected to the operating power terminal, providing a preset second load, and forming a second resonant point set to a frequency different from the first resonant point; a first amplification unit receiving operating power via the first load of the first resonant load unit, having an amplification band characteristic determined according to the first resonant point of the first resonant load unit, and amplifying an input signal; and a second amplification unit receiving operating power via the second load, having an amplification band characteristic determined according to the second resonant point, and amplifying an input signal from the first amplification unit.

10 Claims, 4 Drawing Sheets

WIDE-BAND AMPLIFIER CIRCUIT WITH IMPROVED GAIN FLATNESS

CROSS-REFERENCE TO RELATED APPLICATIONS

This application claims the priority of Korean Patent Application No. 10-2009-0051081 filed on Jun. 9, 2009, in the Korean Intellectual Property Office, the disclosure of which is incorporated herein by reference.

BACKGROUND OF THE INVENTION

1. Field of the Invention

The present invention relates to a wide-band amplifier circuit with improved gain flatness, which is applicable to a $3^{rd}$ Generation Partnership Project Long-Term Evolution (3GPP LTE) system, and more particularly, to a wide-band amplifier circuit with improved gain flatness, which satisfies a requirement for a wide band in a band less than 1 GHz in an upload link frequency band while having high gain flatness.

2. Description of the Related Art

3GPP LTE communications systems, considered to be 4G technology, are techniques that aim at supporting various services based on packet data transfer. The 3GPP LTE communications systems support a downlink peak data rate of 100 Mbps and an upload link data rate of 50 Mbps with reference to a maximum bandwidth of 20 MHz. 3GPP LTE communications systems ensure improved data rates, low latency, efficient use of frequency resources, mobility, techniques optimized for packet data transfer, and high service quality.

Such 3GPP LTE systems are mobile communications systems suitably evolving for IP networks, so that frequencies and high-speed multimedia services can be used more efficiently than by existing systems. 3GPP LTE mobile communications terminals support a downlink data rate of 30 Mbps and an upload link data rate of 15 Mbps at a mobile speed of 120 km/h in 20 MHz bandwidth. The 3GGP LTE communications terminals provide high-quality high-speed multimedia services and are thus capable of providing mobile image services unlike 3.5G high-speed downlink packet access (HSDPA).

As for bands of less than 1 GHz in the upload link frequency band of a 3GPP LTE communications system, there are total six bands: Band 5 (824 MHz to 849 MHz), Band 6 (830 MHz to 840 MHz), Band 8 (880 MHz to 915 MHz), Band 12 (698 MHz to 716 MHz), Band 13 (777 MHz to 787 MHz) and Band 14 (788 MHz to 798 MHz). A bandwidth from 697 MHz to 915 MHz, including band spacing, that is, a bandwidth of 217 MHZ, is required.

One example of the related art is a low noise amplifier (LNA) used for an ultra wide band (UWB) using a band between 3 GHz and 10 GHz. The LNA amplifies a signal by using an inverter structure, and obtains a wide-band characteristic by using one of two feedback paths. A capacitive parallel feedback path realizes a low and medium frequency range, and an inductive series feedback path realizes a high frequency range, so that the amplifier satisfies the wide band of about 7 GHz.

This related art LNA, having the above feedback structure, achieves high linearity, but has limitations in that it is difficult to implement high gain, and additional circuits and currents need to be added for feedback.

Another example of the related art is an LNA used for 802.11a systems. This LAN has a frequency band from 5.1 GHz to 5.9 GHz, and employs a 2-stage amplifier having a cascode structure. The gain flatness desirably reaches 0.06 dB in this band.

However, a relatively large number of inductors are used in order to obtain a flat gain. This expands the chip size, thereby increasing the unit cost of a chip.

SUMMARY OF THE INVENTION

An aspect of the present invention provides a wide-band amplifier circuit with improved gain flatness, which satisfies a requirement for a wide band in a band less than 1 GHz in an upload link frequency band in a 3GPP LTE system while having high gain flatness.

According to an aspect of the present invention, there is provided a wide-band amplifier circuit with improved gain flatness, including: a first resonant load unit connected to an operating power terminal, providing a preset first load, and forming a preset first resonant point; a second resonant load unit connected to the operating power terminal, providing a preset second load, and forming a second resonant point set to a frequency different from the first resonant point; a first amplification unit receiving operating power via the first load of the first resonant load unit, having an amplification band characteristic determined according to the first resonant point of the first resonant load unit, and amplifying an input signal; and a second amplification unit receiving operating power via the second load of the second resonant load unit, having an amplification band characteristic determined according to the second resonant point of the second resonant load unit, and amplifying an input signal from the first amplification unit.

The first resonant load unit may include: a first inductance part having one end connected to the operating power terminal and having preset inductance; a first resistor connected between the other end of the first inductance part and the first amplification unit; and a first capacitor connected to the other end of the first inductance part and the ground.

The second resonant load unit may include: a first inductor having one end connected to the operating power terminal; a second resistor connected in parallel to the first inductor; a second inductance part having one end connected to the other end of the first inductor, and the other end connected to the second amplification unit; and a second capacitor connected between the other end of the first inductor and an output terminal.

The first amplification unit may include: a first metal oxide semiconductor (MOS) transistor including a drain connected to the first resonant load unit, a gate connected to a first bias voltage terminal via a third resistor and a third capacitor, and a source; and a second MOS transistor having a drain connected to the source of the first MOS transistor, a gate connected to a second bias voltage terminal via a fourth resistor and connected to an input terminal via a first coupling capacitor, and a source connected to the ground via a third inductance part.

The second amplification unit may include a third MOS transistor having a drain connected to the other end of the second inductance part, a gate connected to a third bias voltage terminal via a fifth resistor and connected to the first amplification unit via a second coupling capacitor, and a source connected to the ground via a fourth inductance part.

The first inductance part, the second inductance part, the third inductance part and the fourth inductance part may each be configured as a bonding pad having preset inductance.

According to another aspect of the present invention, there is provided a wide-band amplifier circuit with improved gain flatness, including: a first resonant load unit including a first inductance part configured as a bonding pad having one end connected to an operating power terminal, providing a preset first load, and forming a preset first resonant point; a second resonant load unit including a second inductance part configured as a bonding pad having one end connected to the operating power terminal, providing a preset second load, and forming a second resonant point set to a different frequency from the first resonant point; a first amplification unit receiving operating power via the first load of the first resonant load unit, having an amplification band characteristic determined according to the first resonant point of the first resonant load unit, and amplifying an input signal; and a second amplification unit receiving operating power via the second load of the second resonant load unit, having an amplification band characteristic determined according to the second resonant point of the second resonant load unit, and amplifying an input signal from the first amplification unit.

The first inductance part may have one end connected to the operating power terminal and have preset inductance, and the first resonant load unit may further include: a first resistor connected between the other end of the first inductance part and the first amplification unit; and a first capacitor connected between the other end of the first inductance part and the ground.

The second resonant load unit may further include: a first inductor having one end connected to the operating power terminal, and the other end connected to the second inductance part; a second resistor connected in parallel to the first inductor; and a second capacitor connected between the other end of the first inductor and an output terminal. The second inductance part is connected between the other end of the first inductor and the second amplification unit.

The first amplification unit may include: a first metal oxide semiconductor (MOS) transistor including a drain connected to the first resonant load unit, a gate connected to a first bias voltage terminal via a third resistor and a third capacitor, and a source; and a second MOS transistor including a drain connected to the source of the first MOS transistor, a gate connected to a second bias voltage terminal via a fourth resistor and connected to an input terminal via a first coupling capacitor, and a source connected to the ground via a third inductance part.

The second amplification unit may include a third MOS transistor having a drain connected to the other end of the second inductance part, a gate connected to a third bias voltage terminal via a fifth resistor and connected to the first amplification unit via a second coupling capacitor, and a source connected to the ground via a fourth inductance part.

The first inductance part, the second inductance part, the third inductance part and the fourth inductance part may each be configured as a bonding pad having preset inductance.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
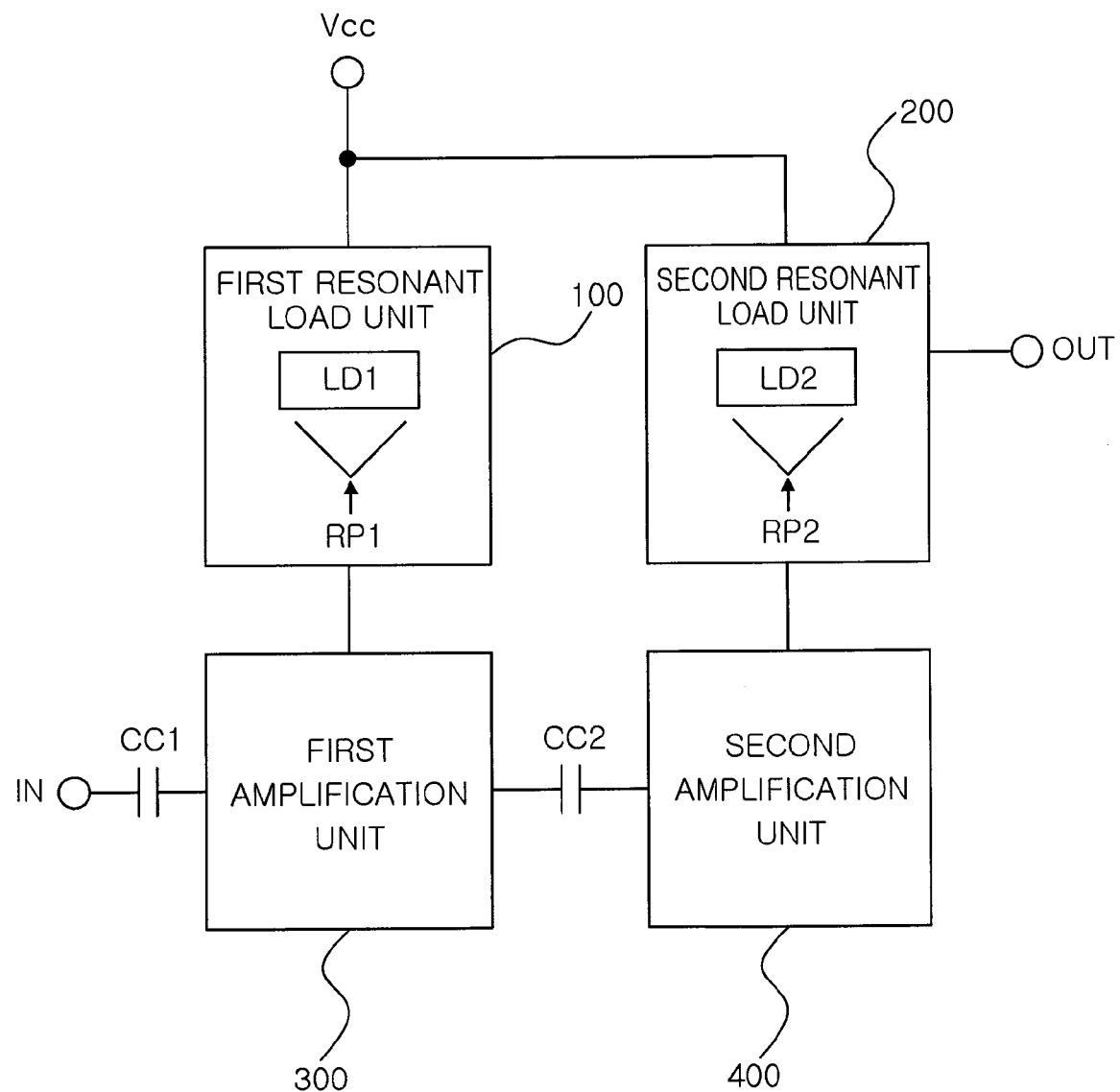
FIG. 1 is a block diagram showing a wide-band amplifier circuit with improved gain flatness according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals in the drawings denote like elements.

FIG. 1 is a block diagram of a wide-band amplifier circuit with improved gain flatness, according to an exemplary embodiment of the present invention.

Referring to FIG. 1, a wide-band amplifier circuit with improved gain flatness, according to an exemplary embodiment of the present invention, includes: a first resonant load unit 100 connected to an operating power terminal Vcc, providing a preset first load LD1, and forming a preset first resonant point RP1; a second resonant load unit 200 connected to the operating power terminal Vcc, providing a preset second load LD2, and forming a second resonant point RP2 set to a different frequency from the first resonant point RP1; a first amplification unit 300 receiving operating power through the first load LD1 of the first resonant load unit 100, having an amplification-band characteristic determined according to the first resonant point RP1 of the first resonant load unit 100, and amplifying an input signal; and a second amplification unit 400 receiving operating power through the second load LD2 of the second resonant load unit 200, having an amplification-band characteristic determined according to the second resonant point RP2 of the second resonant load unit 200, and amplifying an input signal from the first amplification unit 300.

The first load LD1 is provided for the output impedance matching of the first amplification unit 300, and the second load LD2 is provided for the output impedance matching of the second amplification unit 400.

Figure 2:
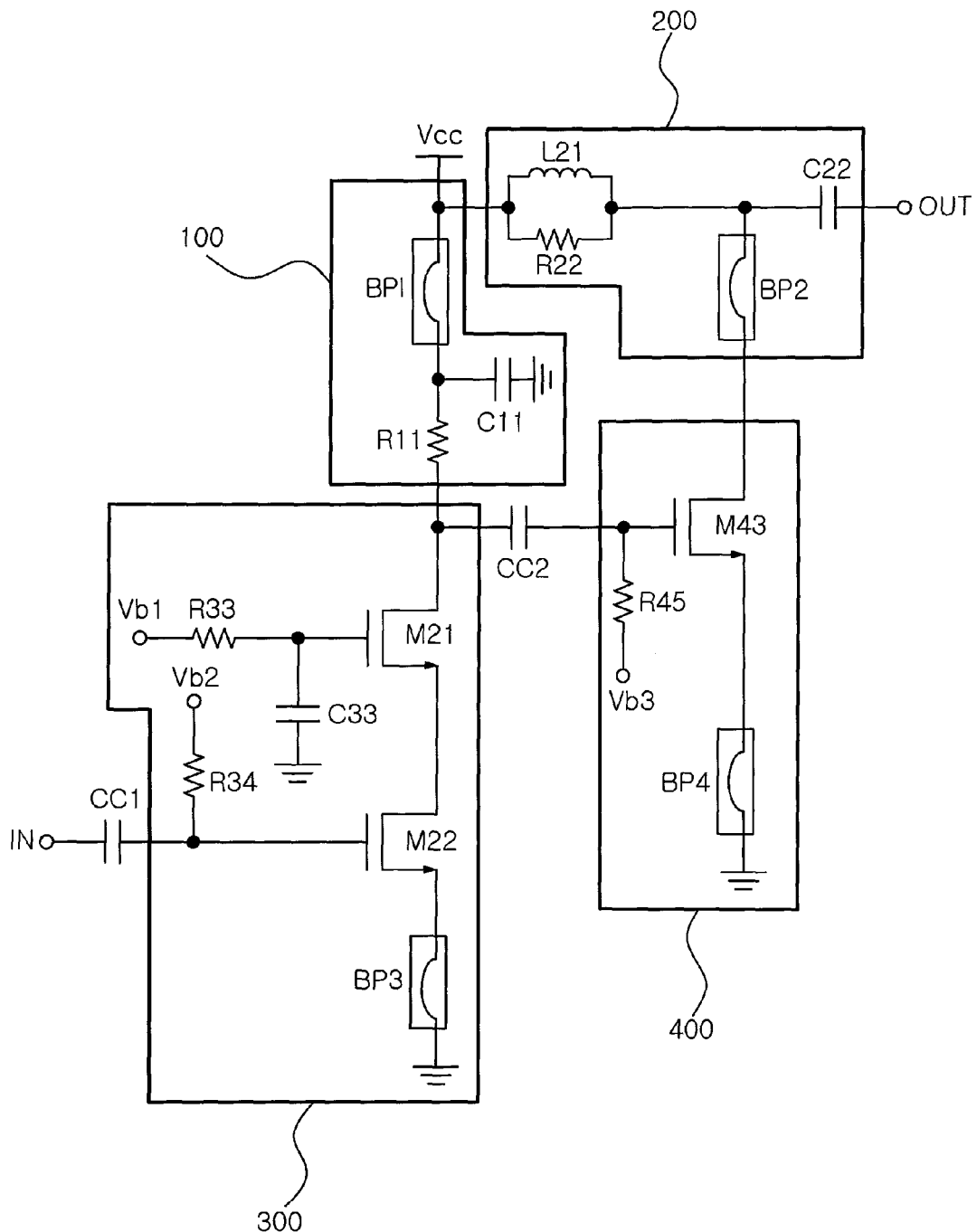
FIG. 2 is a view showing a wide-band amplifier circuit with improved gain flatness in detail according to an exemplary embodiment of the present invention.

FIG. 2 illustrates a wide-band amplifier circuit having improved gain flatness in detail according to an exemplary embodiment of the present invention.

Referring to FIG. 2, the first resonant load unit 100 includes a first inductance part BP1 having one end connected to the operating power terminal Vcc and having preset inductance, a first resistor R11 connected between the other end of the first inductance part BP1 and the first amplification unit 200, and a first capacitor C11 connected between the other end of the first inductance part BP1 and the ground.

Here, the first resistor R11 forms the first load LD1, and the first inductance part BP1 and the first capacitor C11 form the first resonant point RP1.

Referring to FIG. 2, the second resonant load unit 200 includes a first inductor L21 having one end connected to the operating power terminal Vcc, a second resistor R22 connected in parallel to the first inductor L21, a second inductance part BP2 having one end connected to the other end of the first inductance part BP1 and the other end connected to the first amplification unit 200, and a second capacitor C22 connected between the other end of the first inductor L21 and an output terminal OUT.

Here, the second inductance part BP2 forms the second load LD2. The inductance of the parallel circuit of the second inductance part BP2 and the first inductor L21, and the second capacitor C22 form the second resonant point RP2.

Referring to FIG. 2, the first amplification unit 300 may be configured as a single transistor, or into a cascode type that is advantageous in terms of isolation.

The first amplification unit 300, when configured into a cascode type, includes a first metal oxide semiconductor (MOS) transistor M21 and a second MOS transistor M22. The first MOS transistor M21 has a drain connected to the first resonant load unit 100, a gate connected to a first bias voltage terminal Vb1 via a third resistor R33 and a third capacitor C33, and a source. The second MOS transistor M22 has a drain connected to the source of the first MOS transistor M21, a gate connected to a second bias voltage terminal Vb2 via a fourth resistor R34 and also connected to an input terminal IN via a first coupling capacitor CC1, and a source connected to the ground via a third inductance part BP3.

Referring to FIG. 2, the second amplification unit 400 may be configured as a single transistor, or into a cascode type that is advantageous in terms of isolation.

The second amplification unit 400, when configured as a single transistor, may include a third MOS transistor M43 having a drain connected to the other end of the second inductance part BP2, a gate connected to a third bias voltage terminal Vb3 via a fifth resistor R45 and also connected to the first amplifier 300 via a second coupling capacitor CC2, and a source connected to the ground via a fourth inductance part BP4.

Referring to FIGS. 1 and 2, in the wide-band amplifier circuit according to the embodiment of the present invention, the first inductance part BP1, the second inductance part BP2, the third inductance part BP3 and the fourth inductance part BP4 may each be configured as a bonding pad having preset inductance.

In this case, a separate inductor device for providing inductance is unnecessary, thereby contributing to a reduction in size.

Figure 3:
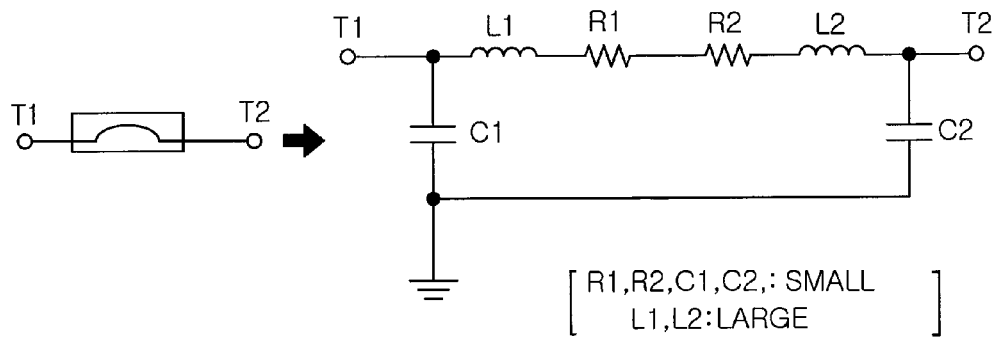
FIG. 3 is an equivalent circuit diagram of a bonding pad according to an exemplary embodiment of the present invention.

FIG. 3 is an equivalent circuit diagram of a bonding pad according to an exemplary embodiment of the present invention.

Referring to FIG. 3, the bonding pad, according to an exemplary embodiment of the present invention, may be equivalently expressed as a circuit in which inductors L1 and L2 and resistors R1 and R2 are connected in series, a single capacitor C1 is connected between one end of this serial circuit and the ground, and another capacitor C2 is connected between the other end of the serial circuit and the ground.

That is, the resistors R1 and R2 and the capacitors C1 and C2 are parasitic components, having a negligibly small value in a band lower than 1 GHz. Therefore, the bonding pad may be equalized only with the inductance of the inductors L1 and L2.

Figure 4:
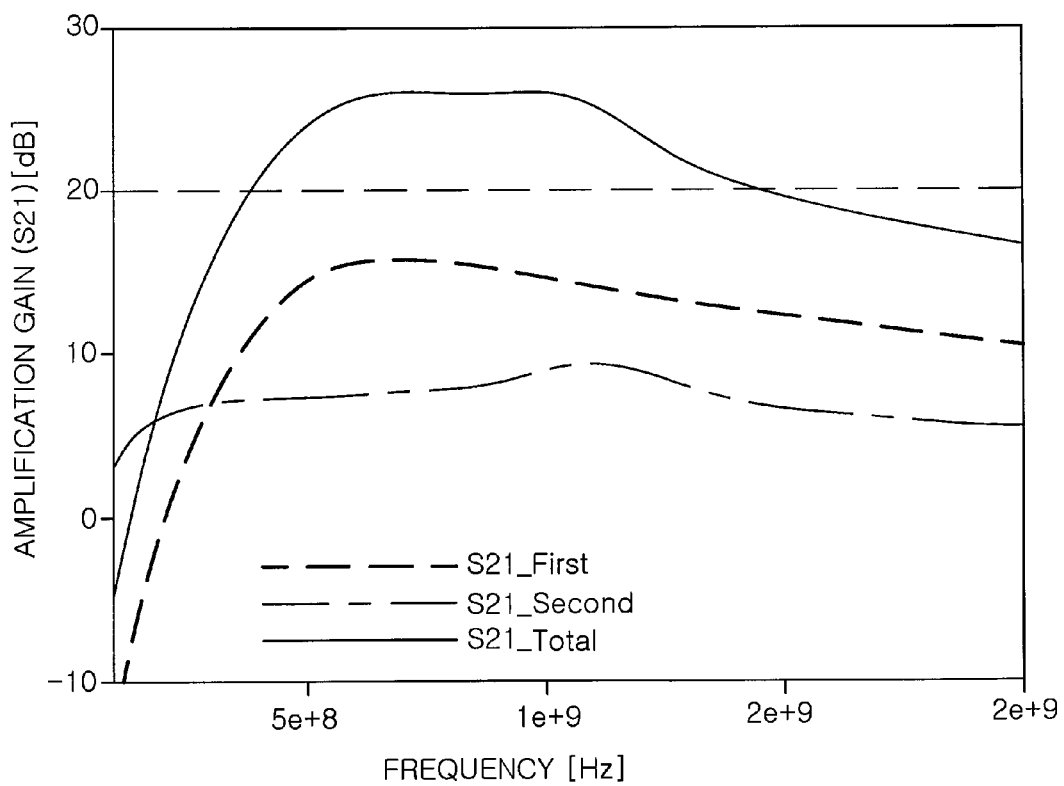
FIG. 4 is a graph showing the characteristic of amplification gain of an amplifier circuit according to an exemplary embodiment of the present invention.

FIG. 4 is a graph showing the characteristics of amplification gain of an amplifier circuit according to an exemplary embodiment of the present invention.

In FIG. 4, 'S21_First' is a curve representing the characteristic of the amplification gain of the first amplification unit 300, 'S21_Second' is a curve representing the characteristic of the amplification gain of the second amplification unit 400, and 'S21_Total' is a curve representing the characteristic of the total amplification gain of the first amplification unit 300 and the second amplification unit 400.

Figure 5:
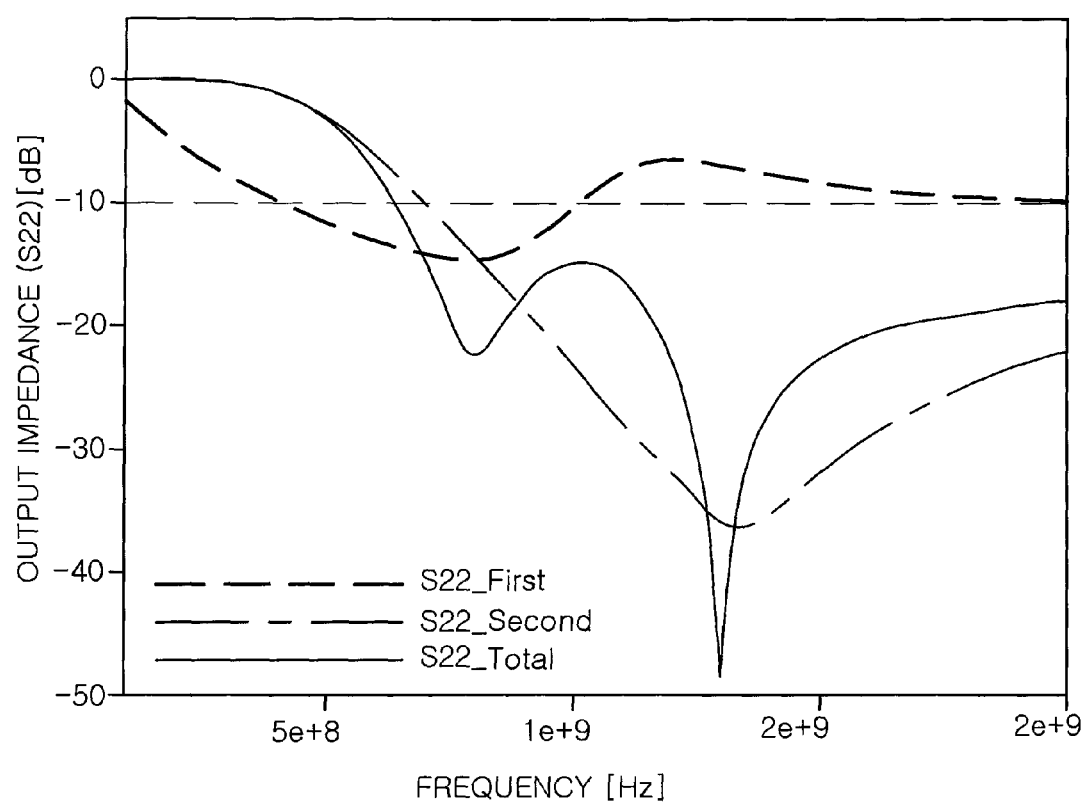
FIG. 5 is a graph showing the characteristic of output impedance of an amplifier circuit according to an exemplary embodiment of the present invention.

FIG. 5 is a graph showing the characteristic of output impedance of an amplifier circuit according to an exemplary embodiment of the present invention.

In FIG. 5, 'S22_First' is a curve representing the characteristic of output impedance of the first amplification unit 300, 'S22_Second' is a curve representing the characteristic of output impedance of the second amplification unit 400, and 'S22_Total' is a curve representing the characteristic of total output impedance of the first amplification unit 300 and the second amplification unit 400.

The operation and effect of the invention will now be described in detail with reference to accompanying drawings.

Referring to FIGS. 1 through 5, the wide-band amplifier circuit with improved gain flatness will now be described. As shown in FIG. 1, the wide-band amplifier includes the first resonant load unit 100, the second resonant load unit 200, the first amplification unit 300, and the second amplification unit 400.

The first resonant load unit 100 is connected to an operating power terminal Vcc, provides a preset first load LD1 for output impedance matching and forms a first resonant point RP1 preset for a wide amplification band.

The second resonant load unit 200 is connected to the operating power terminal Vcc, provides a second load LD2 preset for output impedance matching, and forms a second resonant point RP2 set to a different frequency from the first resonant point RP1 for the wide amplification band.

For example, if an amplification band is set, the first resonant point RP1 may be set to the start point of the amplification band, and the second resonant point RP2 may be set to the end point of the amplification band. Assuming that the bandwidth is about 215 MHz, the frequency at the start point is 700 MHz and the frequency at the end point is 915 MHz, the first resonant point RP1 may be set to 700 MHz, which the start point of the amplification band, and the second resonant point RP2 may be set to 915 MHz, which is the end point of the amplification band. In contrast, the second resonant point RP2 may be set to 700 MHz, which is the start point of the amplification band, and the first resonant point RP1 may be set to 915 MHz, which is the end point of the amplification band.

The first amplification unit 300 receives operating power through the first load LD1 of the first resonant load unit 100. Also, the first amplification unit 300 has an amplification-band characteristic determined according to the first resonant point RP1 of the first resonant load unit 100, amplifies an input signal supplied through the input terminal IN, and outputs it to the second amplification unit 400.

Subsequently, the second amplification unit 400 receives operating power through the second load LD2 of the second resonant load unit 200. Also, the second amplification unit 400 has an amplification-band characteristic determined according to the second resonant point RP2 of the second resonant load unit 300, amplifies an input signal from the first amplification unit 200, and outputs it to the output terminal OUT.

Referring to FIGS. 1 and 2, the first resonant load unit 100 includes the first inductance part BP1, the first resistor R11 and the first capacitor C11.

The first resonant load unit 100 provides the first load LD1 determined by the first inductance part BP1, the first resistor R11 and the first capacitor C11 to thereby achieve the output impedance matching of the first amplification unit 300. Also, the first resonant load unit 100 forms the first resonant point RP1 determined by the first inductance part BP1 and the first capacitor C11 to thereby determine the amplification band of the first amplification unit 300.

In addition, referring to FIG. 2, the second resonant load unit 200 includes the first inductor L21, the second resistor R22, the second inductance part BP2 and the second capacitor C22.

The second resonant load unit 200 provides the second load LD2 determined by the first inductor L21, the second resistor R22, the second inductance part BP2 and the second capacitor C22 to thereby achieve the output impedance matching of the second amplification unit 400. Also, the second resonant load unit 200 forms the second resonant point RP2 determined by the first inductor L21, the second inductance part BP2 and the second capacitor C22 to thereby determine the amplification band of the second amplification unit 400.

The amplification bands of the first amplification unit 300 and the second resonant load unit 200 are determined by the first resonant load unit 100 and the second resonant load unit 200. The amplification band of the amplifier circuit of the present invention can be widened by setting the first resonant point RP1 of the first resonant load unit 100 and the second resonant point RP2 of the second resonant load unit 200 to different frequencies.

In particular, in the amplifier circuit of the embodiment of the present invention, the first inductance part BP1 of the first resonant load unit 100 and the second inductance part BP2 of the second resonant load unit 200 may be configured as bonding pads. This is advantageous in terms of a size reduction because a separate inductance device may not be used.

Referring to FIG. 2, the first amplification unit 300 may be configured as a single transistor, or into a cascode type that is advantageous in terms of isolation.

For example, the first amplification unit 300, when configured into a cascode type, may include the first MOS transistor M21 and the second MOS transistor M22 as shown in FIG. 2.

The first MOS transistor M21 of the first amplification unit 300 is operated by a first bias voltage Vb1 supplied via the third resistor R33 and the third capacitor C33. The second MOS transistor M22 of the first amplification unit 300 is operated by a second bias voltage Vb2 supplied via the fourth resistor R33.

Accordingly, the input signal input via the input terminal IN is amplified by the first MOS transistor M21 and the second MOS transistor M22.

Referring to FIG. 2, the second amplification unit 400 may be configured as a single transistor, or into a cascode type that is advantageous in terms of isolation.

For example, when the second amplification unit 400 is configured as a single transistor, the second amplification unit 400 may include a third MOS transistor M43.

The third MOS transistor M43 is operated by a third bias voltage Vb3 supplied via a fifth resistor R45.

Accordingly, a signal from the first amplification unit 300 is amplified by the third MOS transistor M43.

As described above, referring to FIGS. 1 and 2, in the wide-band amplifier of the embodiment of the present invention, the first inductance part BP1, the second inductance part BP2, the third inductance part BP3 and the fourth inductance part BP4 may each be formed as a bonding pad with preset inductance.

In this case, a separate inductor device for providing inductance is unnecessary, which contributes to a reduction in size.

Referring to FIG. 3, the bonding pad, according to the embodiment of the present invention, may be equivalently expressed as a circuit in which inductors L1 and L2 and resistors R1 and R2 are connected in series, a single capacitor C1 is connected between one end of this serial circuit and the ground, and another capacitor C2 is connected between the other end of the serial circuit and the ground.

Here, the resistors R1 and R2 and the capacitors C1 and C2 are parasitic components, and thus have relatively small values. The inductors L1 and L2 have relatively larger values than the values by the parasitic components.

Hereinafter, a description is made based on a two-port circuit network theory, referring to FIGS. 1 through 5.

The amplifier circuit of an exemplary embodiment of the present invention, based on the cascade-connected two-port circuit network theory, may realize a flat gain and a wide-band frequency response within a desired band since the gain characteristic and output impedance matching of the first amplifier circuit 300 overlap the characteristic of the second amplification unit 400.

That is, according to the two-port circuit network theory, the amplification gain S21total of two cascade-connected circuit networks, that is, the first and second amplification units 300 and 400 is expressed as Equation 1 below:

$$S21\text{total} = K(S21\text{first})*(S21\text{second}), \quad \text{where} \quad K = 1/(1 - S22\text{first}*S11\text{second}) \qquad \text{Eq. 1}$$

The output impedance matching S22total of the first and second amplification units 300 and 400, the two cascade-connected circuit networks, is expressed as Equation 2 below:

$$S22\text{total} = (S22\text{second}) + K(S12\text{second})*(S21\text{second})*(S22\text{first}),$$

$$\text{where } K = 1/(1 - S22\text{first}*S11\text{second}) \qquad \text{Eq. 2}$$

When the output impedance of the first amplification unit 300, which is the first circuit network, and the input impedance of the second amplification unit 400, which is the second circuit network are matched at −10 dB or lower, S22first*S11second is considered to be almost zero. Therefore, K ideally becomes a constant 1.

The total gain of the first and second amplification units 300 and 400, the two cascade-connected circuit networks, is equal to the sum of the respective gains of the circuit networks. When the output impedance of each stage is matched at −10 dB or lower, K, S12 second and S21second become one. Therefore, the output impedance matching of the first amplification unit 300, which is the first circuit network overlaps the output impedance matching of the second amplification unit 400, which is the second circuit network, thereby determining a total output impedance matching curve.

Referring to FIG. 2, the amplifier circuit of the embodiment of the present invention has high gain and linearity so as to be used at the last stage of the upload link. This high gain may be achieved due to the two-stage amplifier configuration.

First, the first amplification unit 300 has a cascode structure using the first resonant load unit 100 including the first resistor R11. This structure realizes a gain characteristic having a wide-band frequency response but causes undesirable low linearity. Therefore, the resistance value of the first resonant load unit 100 is selected so as to satisfy the linearity required by the first amplification unit 300. Also, the cascode structure of the first amplification unit 300 ensures the input/output isolation. For the output impedance matching, the first resonant load unit 100 of the first amplification unit 300 employs the inductor of the bonding pad BP1 connected to supply operating voltage Vcc from the outside, and the first capacitor C11 serving to supply an ideal operating voltage by causing AC components to flow to the ground. That is, the output impedance matching of the first amplification unit 300 is induced by using the inductance and capacitance that are necessarily used, without adding a new device.

The second amplification unit 400 has a common source structure using an open drain. The second resonant load unit 200 of the second amplification unit 400 includes the second inductance part BP2 that may be formed as a bonding pad.

The second amplification unit 400 has an amplification frequency band range less than 1 GHz. In this case, if an inductor is realized as a chip, the size increases undesirably, raising the chip price. To prevent this price increase from occurring, the open drain structure in which the inductor is provided outside is selected, allowing for economical chip implementation.

Furthermore, the second inductance part BP2 is used for the second load LD2 in the second resonant load unit 200, thereby enhancing linearity. The output impedance of the second amplification unit 400 is induced by inductance caused by the parallel connection between the first inductor L21 and the second inductance part BP2, and the second capacitor C22.

In FIG. 4, 'S21_First' is a curve representing the characteristic of the amplification gain of the first amplification unit 300, 'S21_Second' is a curve representing the characteristic of the amplification gain of the second amplification unit 400, and 'S21_Total' is a curve representing the characteristic of the total amplification gain of both the first amplification unit 300 and the second amplification unit 400.

Referring to 'S21_Total' of FIG. 4, it can be seen that the amplification band of the amplifier circuit is about 215 MHz from about 700 MHz to about 915 MHz.

In FIG. 5, 'S22_First' is a curve representing the characteristic of the output impedance of the first amplification unit 300, 'S22_Second' is a curve representing the characteristic of the output impedance of the second amplification unit 400, and 'S22_Total' is a curve representing the characteristic of the total output impedance of the first amplification unit 300 and the second amplification unit 400.

Referring to the graph 'S22_Total' of FIG. 5, it can be seen that the output impedance of the amplifier circuit, according to the present invention, is about −10 [dB] in the range of about 700 MHz to about 915 MHz.

FIGS. 4 and 5 are confirmed by the result of a simulation of the above theoretical contents of the present invention. FIG. 4 shows the gain of the amplifier circuit according to the present invention. As described above in the cascade-connected two-port circuit network theory, it can be seen that the total gain and bandwidth of the entire amplifier circuit is determined by combining 'S21_First' representing the gain of the first amplification unit, which is the first circuit network, with 'S21_Second' representing the gain of the second amplification unit, which is the second circuit network. In FIG. 4, the total gain of the amplifier circuit is represented by 'S21_Total'.

It can be confirmed from FIG. 4 that desired flatness may be obtained within a desired band by controlling the resonant frequency and gain flatness of each circuit network. Here, a flat gain curve of 0.04 dB may be obtained between 700 MHz and 915 MHz, which is a frequency band required by the amplifier circuit of the present invention.

FIG. 5 shows the output impedance matching of the amplifier circuit of the present invention. As described above, FIG. 5 illustrates 'S22_First' having the resonant point of the first amplification unit 300, which is the first circuit network, by using the first inductance part BP1 and the first capacitor C11. FIG. 5 also illustrates 'S22_Second' having the resonant point of the second amplification unit 400, which is the second circuit network, by the inductance caused by the first inductor L21 and the second inductance part BP2, and the second capacitor C22.

Accordingly, it can be seen that as the resonance frequencies overlap each other, 'S22_Total', a curve representing the final output impedance matching can be obtained.

As described so far, according to the present invention, gain flatness among the specifications of an RF amplifier in a transmitter system determines a band usable by a system. Moreover, providing flat gain within a required band may ensure high transmitter performance in areas such as stable linearity and error vector magnitude (EVM). For in-band gain characteristics and output impedance matching, most of wide-band amplifiers employ an inductor (L) and a capacitor (C) at an output terminal, or a feedback structure. However, if the inductor (L) and the capacitor (C) are used to realize a wide-band amplifier, this undesirably increases the number of components being used. If the feedback structure is used, high gain cannot be obtained. Therefore, the amplifier circuit of the present invention may be considered to be a structure suited for high gain and flatness without increasing the number of components being used.

As set forth above, according to exemplary embodiments of the invention, in a 3rd Generation Partnership Project Long Term Evolution (3GPP LTE) system, a wide band required in a band less than 1 GHz in an upload link frequency band is satisfied, and high gain flatness is achieved.

While the present invention has been shown and described in connection with the exemplary embodiments, it will be apparent to those skilled in the art that modifications and variations can be made without departing from the spirit and scope of the invention as defined by the appended claims.

What is claimed is:

1. A wide-band amplifier circuit with improved gain flatness, comprising:
    a first resonant load unit connected to an operating power terminal, configured to provide a preset first load and form a preset first resonant point;
    a second resonant load unit connected to the operating power terminal, configured to provide a preset second load and form a second resonant point set to a frequency different from that of the first resonant point;
    a first amplification unit configured to receive operating power via the first load of the first resonant load unit, have a first amplification band characteristic determined according to the first resonant point of the first resonant load unit, and amplify an input signal; and
    a second amplification unit configured to receive operating power via the second load of the second resonant load unit, have a second amplification band characteristic determined according to the second resonant point of the second resonant load unit, and further amplify the amplified input signal outputted from the first amplification unit,
    wherein the first resonant load unit comprises:
    a first inductance part having one end connected to the operating power terminal and having a first preset inductance;
    a first resistor connected between the other end of the first inductance part and the first amplification unit; and
    a first capacitor connected between the other end of the first inductance part and the ground.

2. The wide-band amplifier circuit of claim 1, wherein the second resonant load unit comprises:
    a first inductor having one end connected to the operating power terminal;
    a second resistor connected in parallel to the first inductor;
    a second inductance part having one end connected to the other end of the first inductor, and the other end connected to the second amplification unit; and a second capacitor connected between the other end of the first inductor and an output terminal.

3. The wide-band amplifier circuit of claim 2, wherein the first amplification unit comprises:
- a first metal oxide semiconductor (MOS) transistor including
  - a drain connected to the first resonant load unit,
  - a gate connected to a first bias voltage terminal via a third resistor and also connected to a third capacitor, and
  - a source; and
- a second MOS transistor having
  - a drain connected to the source of the first MOS transistor,
  - a gate connected to a second bias voltage terminal via a fourth resistor and connected to an input terminal, which is configured to receive the input signal, via a first coupling capacitor, and
  - a source connected to the ground via a third inductance part.

4. The wide-band amplifier circuit of claim 3, wherein the second amplification unit comprises a third MOS transistor having
- a drain connected to the other end of the second inductance part,
- a gate connected to a third bias voltage terminal via a fifth resistor and connected to the first amplification unit via a second coupling capacitor, and
- a source connected to the ground via a fourth inductance part.

5. The wide-band amplifier circuit of claim 4, wherein the first inductance part, the second inductance part, the third inductance part and the fourth inductance part are each configured as a bonding pad,
the second, third, and fourth inductance parts having a second, a third, and a fourth preset inductances, respectively.

6. A wide-band amplifier circuit with improved gain flatness, comprising:
- a first resonant load unit comprising a first inductance part configured as a bonding pad having one end connected to an operating power terminal, the first resonant load unit being configured to provide a preset first load and form a preset first resonant point;
- a second resonant load unit comprising a second inductance part configured as a bonding pad having one end connected to the operating power terminal, the second resonant load unit being configured to provide a preset second load and form a second resonant point set to a frequency different from that of the first resonant point;
- a first amplification unit configured to receive operating power via the first load of the first resonant load unit, have a first amplification band characteristic determined according to the first resonant point of the first resonant load unit, and amplify an input signal; and
- a second amplification unit configured to receive operating power via the second load of the second resonant load unit, have a second amplification band characteristic determined according to the second resonant point of the second resonant load unit, and further amplify the amplified input signal outputted from the first amplification unit, wherein the first inductance part has one end connected to the operating power terminal and has a first preset inductance, and
the first resonant load unit further comprises:
- a first resistor connected between the other end of the first inductance part and the first amplification unit; and
- a first capacitor connected between the other end of the first inductance part and the ground.

7. The wide-band amplifier circuit of claim 6, wherein the second resonant load unit further comprises:
- a first inductor having one end connected to the operating power terminal, and the other end connected to the second inductance part;
- a second resistor connected in parallel to the first inductor; and
- a second capacitor connected between the other end of the first inductor and an output terminal, wherein the second inductance part is connected between the other end of the first inductor and the second amplification unit.

8. The wide-band amplifier circuit of claim 7, wherein the first amplification unit comprises:
- a first metal oxide semiconductor (MOS) transistor including
  - a drain connected to the first resonant load unit,
  - a gate connected to a first bias voltage terminal via a third resistor and also connected to a third capacitor, and
  - a source; and
- a second MOS transistor including
  - a drain connected to the source of the first MOS transistor,
  - a gate connected to a second bias voltage terminal via a fourth resistor and connected to an input terminal, which is configured to receive the input signal, via a first coupling capacitor, and
  - a source connected to the ground via a third inductance part.

9. The wide-band amplifier circuit of claim 8, wherein the second amplification unit comprises a third MOS transistor having
- a drain connected to the other end of the second inductance part,
- a gate connected to a third bias voltage terminal via a fifth resistor and connected to the first amplification unit via a second coupling capacitor, and
- a source connected to the ground via a fourth inductance part.

10. The wide-band amplifier circuit of claim 9, wherein the third inductance part and the fourth inductance part are each configured as a bonding pad,
the second, third and fourth inductance parts having a second, a third and a fourth preset inductances, respectively.

* * * * *